US010930567B2

(12) United States Patent
Lee et al.

(10) Patent No.: US 10,930,567 B2
(45) Date of Patent: Feb. 23, 2021

(54) MASKLESS EPITAXIAL GROWTH OF PHOSPHORUS-DOPED SI AND BORON-DOPED SIGE (GE) FOR ADVANCED SOURCE/DRAIN CONTACT

(71) Applicant: INTERNATIONAL BUSINESS MACHINES CORPORATION, Armonk, NY (US)

(72) Inventors: Choonghyun Lee, Rensselaer, NY (US); Shogo Mochizuki, Clifton Park, NY (US); Chun Wing Yeung, Niskayuna, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/446,808

(22) Filed: Jun. 20, 2019

(65) Prior Publication Data

US 2019/0318970 A1    Oct. 17, 2019

Related U.S. Application Data

(62) Division of application No. 15/954,133, filed on Apr. 16, 2018, now Pat. No. 10,431,502.

(51) Int. Cl.
*H01L 21/70* (2006.01)
*H01L 21/8238* (2006.01)
(Continued)

(52) U.S. Cl.
CPC .......... *H01L 21/823871* (2013.01); *H01L 21/76805* (2013.01); *H01L 21/76843* (2013.01);
(Continued)

(58) Field of Classification Search
CPC ..... H01L 21/823871; H01L 21/823814; H01L 21/823878
See application file for complete search history.

(56) References Cited

U.S. PATENT DOCUMENTS 6,069,385 A    5/2000   Blanchard
6,836,001 B2  12/2004   Yamauchi et al.
(Continued)

FOREIGN PATENT DOCUMENTS

CN           103839818 B      1/2018

OTHER PUBLICATIONS

Anonymous, Junctionless Vertical CMOS Transistor with dual channel combining SiGe and III-V, Apr. 4, 2018, IP.com (Year: 2018).*

(Continued)

*Primary Examiner* — Stephen M Bradley
*Assistant Examiner* — Wasiul Haider
(74) *Attorney, Agent, or Firm* — Tutunjian & Bitetto, P.C.; Douglas Pearson (57) ABSTRACT

A method is presented for forming a transistor having reduced parasitic contact resistance. The method includes forming a first device over a semiconductor structure, forming a second device adjacent the first device, forming an ILD over the first and second devices, and forming recesses within the ILD to expose the source/drain regions of the first device and the source/drain regions of the second device. The method further includes forming a first dielectric layer over the ILD and the top surfaces of the source/drain regions of the first and second devices, a chemical interaction between the first dielectric layer and the source/drain regions of the second device resulting in second dielectric layers formed over the source/drain regions of the second device, and forming an epitaxial layer over the source/drain regions (Continued)

of the first device after removing remaining portions of the first dielectric layer.

18 Claims, 7 Drawing Sheets

(51) Int. Cl.
    *H01L 21/768* (2006.01)
    *H01L 23/535* (2006.01)
    *H01L 27/092* (2006.01)
    *H01L 29/08* (2006.01)
    *H01L 29/06* (2006.01)
    *H01L 29/161* (2006.01)
    *H01L 29/167* (2006.01)
    *H01L 29/45* (2006.01)

(52) U.S. Cl.
    CPC .. *H01L 21/76889* (2013.01); *H01L 21/76895* (2013.01); *H01L 21/823814* (2013.01); *H01L 21/823878* (2013.01); *H01L 23/535* (2013.01); *H01L 27/092* (2013.01); *H01L 29/0653* (2013.01); *H01L 29/0847* (2013.01); *H01L 29/161* (2013.01); *H01L 29/167* (2013.01); *H01L 29/45* (2013.01)

(56) References Cited

U.S. PATENT DOCUMENTS

| | | | |
|---|---|---|---|
| 7,605,433 B2 | 10/2009 | Williams | |
| 8,183,646 B2 | 5/2012 | Chau et al. | |
| 8,358,012 B2 | 1/2013 | Haran et al. | |
| 8,703,556 B2 | 4/2014 | Kelly et al. | |
| 8,994,104 B2 | 3/2015 | Glass et al. | |
| 9,601,598 B2 | 3/2017 | Perng et al. | |
| 9,627,535 B2 | 4/2017 | Xie et al. | |
| 9,647,118 B2* | 5/2017 | Xu | H01L 21/02381 |
| 2003/0162348 A1* | 8/2003 | Yeo | H01L 21/28114 438/218 |
| 2010/0065924 A1* | 3/2010 | Lin | H01L 29/6653 257/408 |
| 2011/0284817 A1* | 11/2011 | Sasago | H01L 27/1021 257/5 |
| 2012/0032275 A1* | 2/2012 | Haran | H01L 21/28518 257/401 |
| 2013/0248999 A1 | 9/2013 | Glass et al. | |
| 2013/0320317 A1* | 12/2013 | Lee | H01L 29/78606 257/40 |
| 2016/0358826 A1* | 12/2016 | Niimi | H01L 21/823871 |
| 2018/0151378 A1* | 5/2018 | Huang | H01L 29/0847 |
| 2018/0374749 A1* | 12/2018 | Wong | H01L 21/76889 |

OTHER PUBLICATIONS

Wang et al., "Desorption Kinetics of GeO from GeO2/Ge Structure," Journal of Applied Physics. vol. 108, No. 054104. Sep. 7, 2010. pp. 1-8.

List of IBM Patents or Patent Applications Treated as Related dated Jun. 20, 2019, 2 pages.

* cited by examiner

MASKLESS EPITAXIAL GROWTH OF PHOSPHORUS-DOPED SI AND BORON-DOPED SIGE (GE) FOR ADVANCED SOURCE/DRAIN CONTACT

BACKGROUND

Technical Field

The present invention relates generally to semiconductor devices, and more specifically, to enabling maskless epitaxial growth of phosphorous-doped silicon (Si:P) and boron-doped silicon-germanium (SiGe:B) for advanced source/drain contact.

Description of the Related Art

In 7 nm node technology and beyond, contact resistivity of less than $2e^{-9}$ $\Omega \cdot cm^2$ is desired for both an n-type field effect transistor (nFET) and a p-type field effect transistor (pFET). A conventional metal liner contact generally has contact resistivity of greater than $1e^{-8}$ $\Omega \cdot cm^2$ for either the nFET or the pFET due to contact reactive ion etch (RIE) damage and residue at the bottom of the contact trench. The trench epitaxial growth (silicon phosphorous (Si:P) for nFET, germanium (Ge) for pFET) can resolve such issues because metal on Ge has an intrinsically very low Schottky barrier height due to metal Fermi level pinning to the valance band of Ge. Ge epitaxial layer growth within the contact trench can reduce the Schottky barrier height (SBH) with a clean metal-Ge interface. However, the trench epitaxial growth can be complicated to integrate with the current complementary metal oxide semiconductor (CMOS) process, as it requires more masks and patterning process.

SUMMARY

In accordance with an embodiment, a method is provided for forming a transistor having reduced parasitic contact resistance. The method includes forming a first device over a semiconductor structure, forming a second device adjacent the first device, the first and second devices separated from each other by a sidewall trench isolation (STI) region, forming an interlayer dielectric (ILD) over the first and second devices, forming recesses within the ILD to expose the source/drain regions of the first device and the source/drain regions of the second device, forming a first dielectric layer over the ILD and the top surfaces of the source/drain regions of the first and second devices, a chemical interaction between the first dielectric layer and the source/drain regions of the second device resulting in second dielectric layers formed over the source/drain regions of the second device, removing remaining portions of the first dielectric layer, and forming an epitaxial layer over the source/drain regions of the first device.

In accordance with another embodiment, a method is provided for forming a transistor having reduced parasitic contact resistance. The method includes forming an nFET and a pFET device over a semiconductor structure, forming an interlayer dielectric (ILD) over the nFET and pFET devices, selectively recessing the ILD to expose a top surface of the source/drain regions of the nFET and the pFET devices, and forming a $GeO_2$ layer over the source/drain regions of the nFET and the pFET devices, the $GeO_2$ layer over the source/drain regions of the pFET being converted to a $SiO_2$ overlayer and a Ge-rich underlayer via a selective Ge condensation process.

In accordance with yet another embodiment, a semiconductor structure is presented for constructing a transistor having reduced parasitic contact resistance. The semiconductor structure includes a first device disposed over a semiconductor structure, a second device disposed adjacent the first device, the first and second devices separated from each other by a sidewall trench isolation (STI) region, an interlayer dielectric (ILD) disposed over the first and second devices, recesses disposed within the ILD to expose the source/drain regions of the first device and the source/drain regions of the second device, a first dielectric layer disposed over the ILD and the top surfaces of the source/drain regions of the first and second devices, a chemical interaction between the first dielectric layer and the source/drain regions of the second device resulting in second dielectric layers disposed over the source/drain regions of the second device, and an epitaxial layer disposed over the source/drain regions of the first device after removing remaining portions of the first dielectric layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming transistor devices having reduced parasitic contact resistance. Increased drive current in the transistors can be achieved by reducing device resistance. Contact resistance is one component of a device's overall resistance. A conventional transistor contact stack includes, for example, a silicon or silicon germanium (SiGe) source/drain layer, a titanium silicide layer, a titanium nitride adhesion layer, and a tungsten contact/pad. In such configurations, the contact resistance is effectively limited by the silicon or SiGe valence band alignment to the pinning level in the metal.

Embodiments in accordance with the present invention provide methods and devices for employing a maskless process scheme for the trench epitaxial source/drain formation. Conventional trench epitaxial source/drain formation requires at least two masks to have two different source/drain epitaxial layers on the nFET and pFET. However, the exemplary embodiments of the present invention do not require the mask for the patterning, which can significantly reduce the process complexity.

Embodiments in accordance with the present invention provide methods and devices for employing a maskless process scheme by forming an intermediate phosphorous-doped silicon layer provided between the source/drain and contact metals in a first device and a boron-doped silicon germanium layer provided between the source/drain and contact metals in a second device to significantly reduce band misalignment values and contact resistance. Such embodiments effectively marry superior contact properties of germanium (Ge) with superior semiconductor transistor properties of silicon (Si) and SiGe to provide next generation low resistance contacts. Modification of a SiGe:B surface in the pFET device due to the reaction of germanium dioxide ($GeO_2$) with the SiGe surface during the selective Ge condensation process in inert gas ambient results in a maskless fabrication process.

Numerous transistor configurations and suitable fabrication processes will be apparent in light of this disclosure, including both planar and non-planar transistor structures (e.g., such as double-gate and tri-gate transistor structures), as well as strained and unstrained channel structures. Any number of such structural features and material systems can be employed in conjunction with silicide layers formed over Si:P and SiGe:B layers as described herein. The transistor structure can include p-type source/drain regions, n-type source/drain regions, or both n-type and p-type source/drain regions. In some example embodiments, the transistor structure includes dopant-implanted source/drain regions or epitaxial (or poly) replacement source/drain regions of silicon, SiGe alloys, or nominally pure germanium films (e.g., such as those with less than 10% silicon) in a metal oxide semiconductor (MOS) structure.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
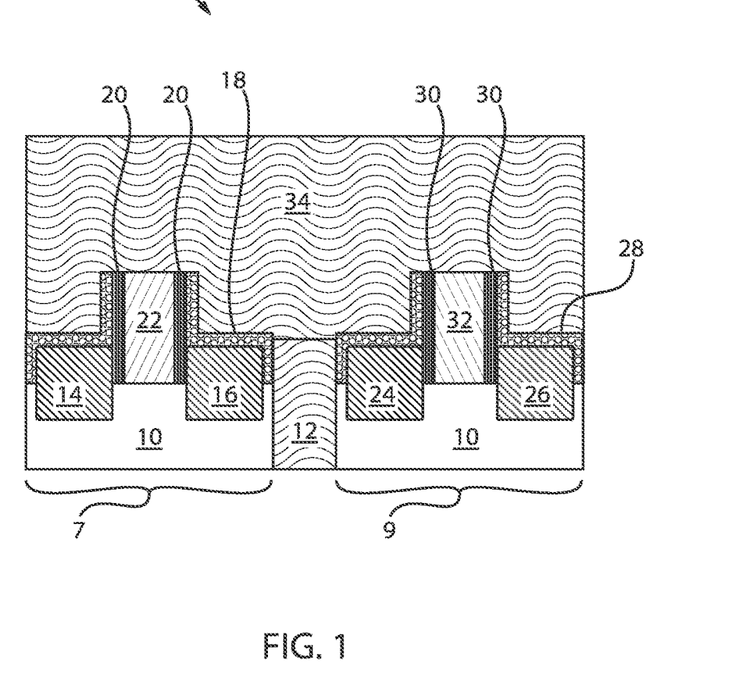
FIG. 1 is a cross-sectional view of a semiconductor structure defining a middle-of-line (MOL) trench silicide module, in accordance with an embodiment of the present invention.

FIG. 1 is a cross-sectional view of a semiconductor structure defining a middle-of-line (MOL) trench silicide module, in accordance with an embodiment of the present invention.

An exemplary semiconductor structure 5 of the present disclosure is shown, which includes a semiconductor substrate 10 and a shallow trench isolation (STI) structure 12. The semiconductor substrate 10 can be a bulk substrate including a bulk semiconductor material throughout, or a semiconductor-in-insulator (SOI) substrate (not shown) including a top semiconductor layer, a buried insulator layer located under the top semiconductor layer, and a bottom semiconductor layer located under the buried insulator layer. The semiconductor material of the semiconductor substrate 10 can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

The first device region 7 includes a semiconductor material having a doping of a first conductivity type at a first dopant concentration. The semiconductor substrate 10 further includes a second device region 9 including the semiconductor material and having a doping of a second conductivity type, wherein the second conductivity type is the opposite of the first conductivity type. The first device region 7 can have an n-type doping and the second device region 9 can have a p-type doping, or vice versa.

The semiconductor substrate 10 can be a bulk substrate, a semiconductor-on-insulator (SOI) substrate, or a hybrid substrate having a bulk portion and an SOI portion. While the present disclosure is described with a bulk substrate, embodiments employing an SOI substrate or a hybrid substrate are explicitly contemplated herein.

The exemplary semiconductor structure 5 thus includes a first device region 7 and a second device region 9, each formed on and including a portion of the semiconductor substrate 10. The first device region 7 can include a metal-oxide-semiconductor field effect transistor (MOSFET) of one conductivity type, and the second device region 9 can include a MOSFET of the opposite conductivity type. For illustrative purposes, the first device region 7 includes an n-type field effect transistor (pFET), and the second device region 9 can include an n-type field effect transistor (nFET).

A gate conductor 22 in the first device region 7 is herein referred to as a first gate conductor and the gate conductor 32 in the second device region 9 is herein referred to as a second gate conductor. The gate conductors 22, 32 can include a doped semiconductor material such as doped polysilicon or a doped polycrystalline silicon alloy, or can include a metal gate material. Alternately, a replacement gate integration scheme can be employed, in which a dummy gate stack is formed first, followed by deposition of a gate-level dielectric material layer and planarization thereof, removal of the material of the dummy gate stack, and deposition of a permanent gate dielectric and a permanent gate electrode.

A first gate spacer 20 is formed on the sidewalls of the first gate conductor 22 in the first device region 7. A second gate spacer 30 is formed on the sidewalls of the second gate conductor 32 in the second device region 9. Preferably, the first and second gate spacers 20, 30 include silicon nitride (SiN). The first and second gate spacers 20, 30 can have a thickness from about 3 nm to about 30 nm, and usually from about 5 nm to about 20 nm, although lesser and greater thicknesses are contemplated herein also.

Dielectric liners or layers 18, 28 can be formed adjacent the first and second gate spacers 20, 30, respectively. The dielectric liners 18, 28 includes a dielectric nitride or dielectric oxide. For example, the dielectric liners 18, 28 can include silicon nitride (SiN). The dielectric liners 18, 28 can be formed by plasma enhanced chemical vapor deposition (PECVD), low pressure chemical vapor deposition (LPCVD), rapid thermal chemical vapor deposition (RTCVD), high density plasma chemical vapor deposition (HDPCVD), or other known deposition techniques. The thickness of the dielectric liners 18, 28 can be from about 3 nm to about 20 nm, although lesser and greater thicknesses are also contemplated herein.

First source/drain trenches 14, 16 include a first source side trench 14 formed on one side of the first gate electrode 22 and a first drain side trench 16 formed on the other side of the first gate electrode 22. Some edges of the first source/drain trenches 14, 16 are substantially self-aligned to the outer sidewalls of the first gate spacer 20. Other edges of the first source/drain trenches 14, 16 can be self-aligned to the edges of the shallow trench isolation structures 12. Preferably, the depth of the first source/drain trenches 14, 16 is less than the depth of the shallow trench isolation structure 12. The depth of the first source/drain trenches 14, 16 can be from about 10 nm to about 150 nm, and usually from about 20 nm to about 100 nm, although lesser and greater depths are contemplated herein also. The first source/drain regions 14, 16 can be, e.g., formed from phosphorous-doped silicon (Si:P).

Second source/drain trenches 24, 26 include a second source side trench 24 formed on one side of the second gate electrode 32 and a second drain side trench 26 formed on the other side of the second gate electrode 32. Some edges of the second source/drain trenches 24, 26 are substantially self-aligned to the outer sidewalls of the second gate spacer 30. Other edges of the second source/drain trenches 24, 26 can be self-aligned to the edges of the shallow trench isolation structures 12. Preferably, the depth of the second source/drain trenches 24, 26 is less than the depth of the shallow trench isolation structure 12. The depth of the second source/drain trenches 24, 26 can be from about 10 nm to about 150 nm, and usually from about 20 nm to about 100 nm, although lesser and greater depths are contemplated herein also. The second source/drain regions 24, 26 can be, e.g., formed from boron-doped silicon germanium (SiGe:B).

In various exemplary embodiments, an oxide fill takes place. The ILD oxide 34 can be planarized. The height of the ILD oxide 34 can be reduced by chemical-mechanical polishing (CMP) and/or etching. Therefore, the planarization process can be provided by CMP. Other planarization process can include grinding and polishing.

In one or more embodiments, the ILD oxide 34 can have a thickness in the range of about 10 nm to about 150 nm, or in the range of about 30 nm to about 100 nm.

The ILD 34 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™ other carbon containing materials, organo-inorganic materials such as spin-on glasses and silsesquioxane-based materials, and diamond-like carbon (DLC), also known as amorphous hydrogenated carbon, $\alpha$-C:H. Additional choices for the ILD 34 include any of the aforementioned materials in porous form, or in a form that changes during processing to or from being porous and/or permeable to being non-porous and/or non-permeable.

Figure 2:
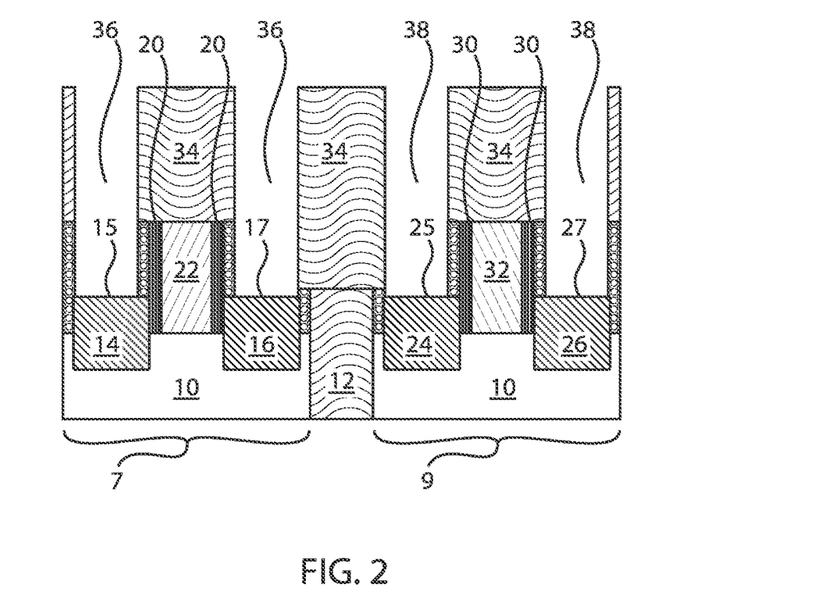
FIG. 2 is a cross-sectional view of the semiconductor structure of FIG. 1 where the ILD is recessed to access the source/drain regions of the n-type field effect transistor (nFET) and the p-type field effect transistor (pFET), in accordance with an embodiment of the present invention.

FIG. 2 is a cross-sectional view of the semiconductor structure of FIG. 1 where the ILD is recessed to access the source/drain regions of the n-type field effect transistor (nFET) and the p-type field effect transistor (pFET), in accordance with an embodiment of the present invention.

In various exemplary embodiments, the ILD 34 is recessed to form openings 36 in the nFET device 7 and to form openings 38 in the pFET device 9. The openings 36 expose a top surface 15 of the source region 14 and a top surface 17 of the drain region 16 in the nFET device 7. The openings 38 expose a top surface 25 of the source region 24 and a top surface 27 of the drain region 26 in the pFET device 9. The recesses also expose inner surfaces of the dielectric liners 18, 28. It is noted that the source/drain regions 14, 16 of the nFET 7 and the source/drain regions 24, 26 of the pFET 9 are opened at the same time or concurrently.

Figure 3:
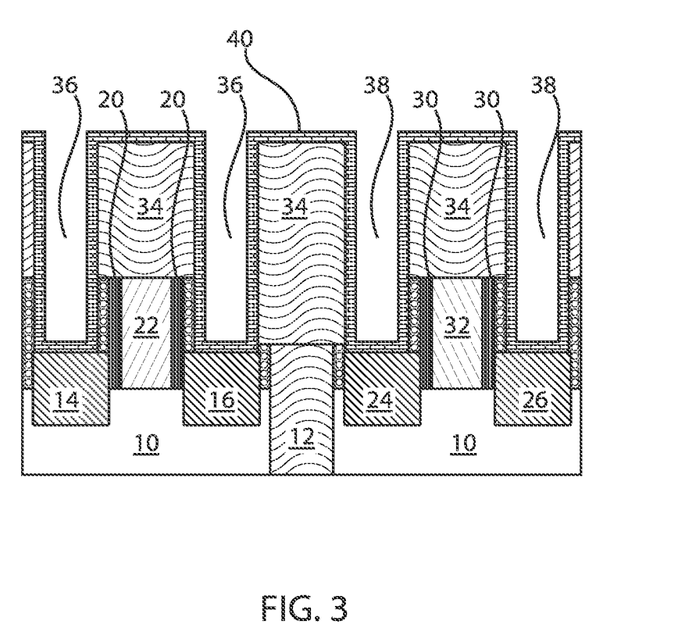
FIG. 3 is a cross-sectional view of the semiconductor structure of FIG. 2 where a dielectric liner is formed over the structure, in accordance with an embodiment of the present invention.

FIG. 3 is a cross-sectional view of the semiconductor structure of FIG. 2 where a dielectric liner is formed over the structure, in accordance with an embodiment of the present invention.

In various exemplary embodiments, a dielectric liner 40 is formed over the structure. The dielectric liner 40 can be formed from germanium dioxide ($GeO_2$). The $GeO_2$ liner 40 can be deposited by, e.g., atomic layer deposition (ALD). The thickness of the $GeO_2$ liner 40 can range between about 3 nm to about 6 nm. The $GeO_2$ liner 40 directly contacts a top surface of the first source/drain regions 14, 16 in the nFET device 7 and directly contacts a top surface of the second source/drain regions 24, 26 in the pFET device 9.

Figure 4:
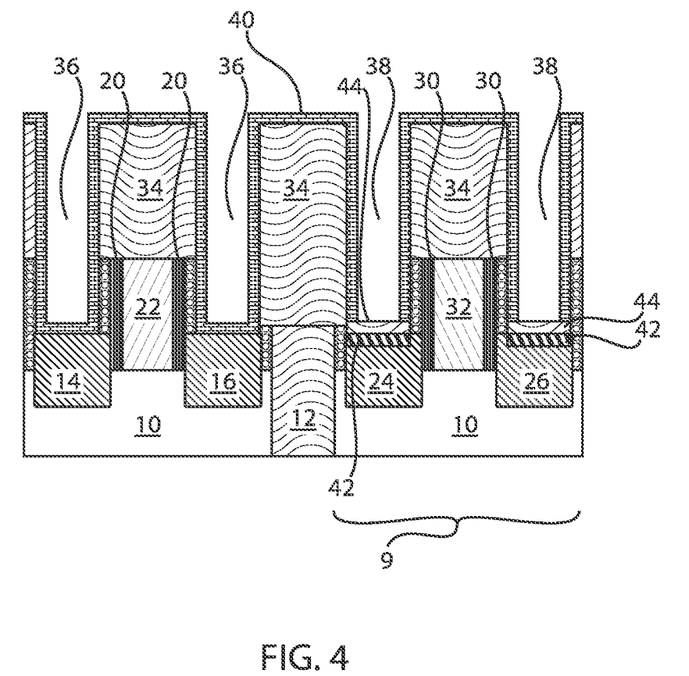
FIG. 4 is a cross-sectional view of the semiconductor structure of FIG. 3 where a dielectric layer and a epitaxial growth layer (germanium-rich) are formed over the source/drain regions of the pFET, in accordance with an embodiment of the present invention.

FIG. 4 is a cross-sectional view of the semiconductor structure of FIG. 3 where a dielectric layer and a epitaxial growth layer (germanium-rich) are formed over the source/drain regions of the pFET, in accordance with an embodiment of the present invention.

In various exemplary embodiments, in the pFET device 9 only, the $GeO_2$ liner 40 is converted to a silicon dioxide ($SiO_2$) layer 44. Additionally, a germanium-rich layer 42 is formed under the $SiO_2$ layer 44. The conversion occurs due to selective germanium condensation on the surface of the SiGe surface. The condensation can occur, e.g., at a temperature of about 450° C. for about 5 seconds or below. The chemical reaction is as follows: $Si+Ge+2GeO_2 \rightarrow Ge+2GeO+SiO_2$. The chemical interaction involves selective germanium (Ge) condensation in inert gas ambient. The chemical reaction takes place only over the source/drain regions 24, 26 of the pFET 9.

Figure 5:
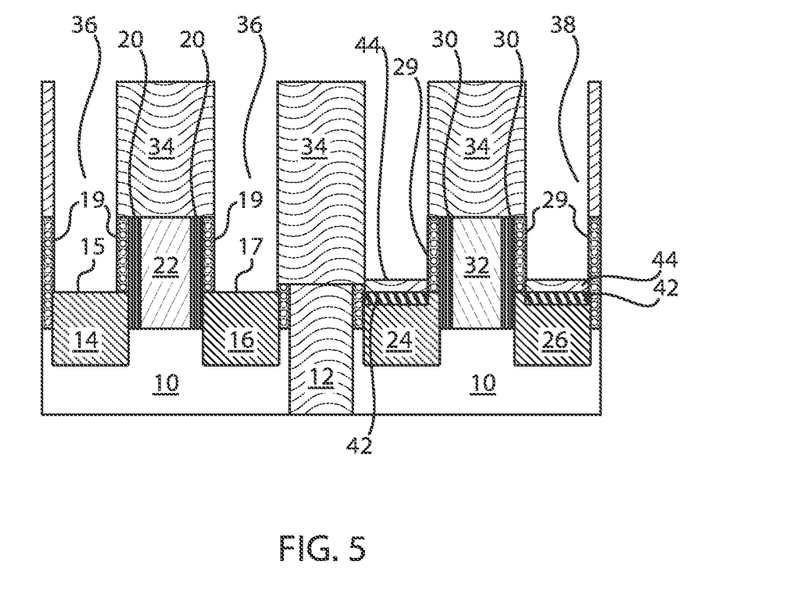
FIG. 5 is a cross-sectional view of the semiconductor structure of FIG. 4 where the dielectric liner is removed, in accordance with an embodiment of the present invention.

FIG. 5 is a cross-sectional view of the semiconductor structure of FIG. 4 where the dielectric liner is removed, in accordance with an embodiment of the present invention.

In various exemplary embodiments, the remaining or unreacted $GeO_2$ is etched away by, e.g., applying deionized water (DIW). The removal of the unreacted $GeO_2$ results in the exposure of the top surface 15 of the source region 14 and the top surface 17 of the drain region 16 of the nFET 7. The top surface of the source/drain regions 24, 26 of the pFET 9 is covered by the $SiO_2$ layers 44 formed from the condensation process of FIG. 4. Additionally, sidewalls 19 of the dielectric liner 18 of the nFET device 7 are exposed and sidewalls 29 of the dielectric liner 28 of the pFET device 9 are exposed.

Figure 6:
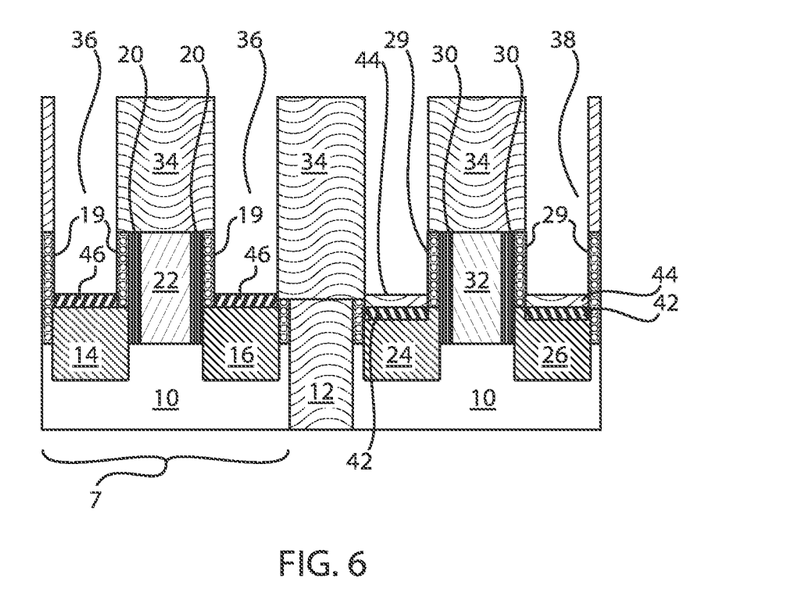
FIG. 6 is a cross-sectional view of the semiconductor structure of FIG. 5 where an epitaxial growth layer (phosphorous-rich) is formed over the source/drain regions of the nFET, in accordance with an embodiment of the present invention.

FIG. 6 is a cross-sectional view of the semiconductor structure of FIG. 5 where an epitaxial growth layer (phosphorous-rich) is formed over the source/drain regions of the nFET, in accordance with an embodiment of the present invention.

In various exemplary embodiments, epitaxial growth occurs on the top surface of the source/drain regions 14, 16 of the first device 7 (nFET) to form epitaxial layers 46 thereon. No masks are necessary at this step because the pFET already has $SiO_2$ layers 44 formed over the source/drain regions 24, 26. Thus, a maskless process takes place for the Si:P and the Ge-rich SiGe:B at the source/drain regions. Ge-rich SiGe:B layer 42, in which Ge concentration is at least 10% higher than the original SiGe:B regions 24, 26. In other words, no additional masks are employed to, e.g., shield the source/drain regions 24, 26 of the pFET 9 because the $SiO_2$ layers 44 formed over the source/drain regions 24, 26 act as a shield. Therefore, this invention discloses methods and systems for the trench epitaxial growth of both Si:P and Ge-rich SiGe:B at the S/D region without additional masks, which can reduce the contact resistance of both nFET and pFET as well as process complexity. Further, this invention discloses use of ALD-$GeO_2$ layer in MOL module to have a selective Ge condensation at SiGe:B S/D region. The exemplary embodiments of the present invention only modify the SiGe:B surface in pFET due to the reaction of $GeO_2$ with SiGe surface during the selective Ge condensation process in inert gas ambient.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 7:
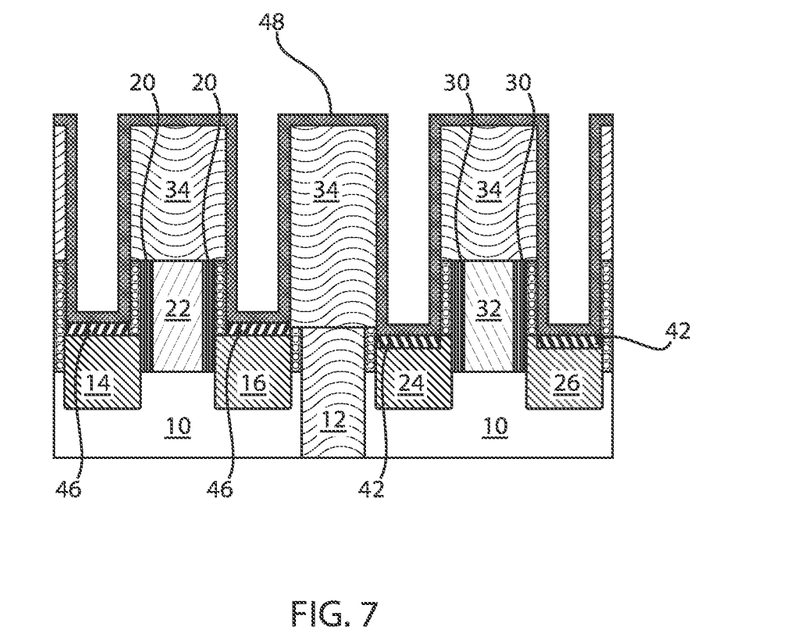
FIG. 7 is a cross-sectional view of the semiconductor structure of FIG. 6 where a barrier liner is formed over the structure, in accordance with an embodiment of the present invention.

FIG. 7 is a cross-sectional view of the semiconductor structure of FIG. 6 where a barrier liner is formed over the structure, in accordance with an embodiment of the present invention.

In various exemplary embodiments, the $SiO_2$ layers 44 in the pFET device 9 are removed by a preclean process. Then, a barrier layer 48 is formed over the structure. The barrier layer 48 can be, e.g., a titanium/titanium nitride (Ti/TiN) liner 48. The barrier layer 48 directly contacts a top surface of the epitaxial layers 46 of the nFET device 7 and directly contacts a top surface of the germanium-rich layers 42 of the pFET device 9.

Figure 8:
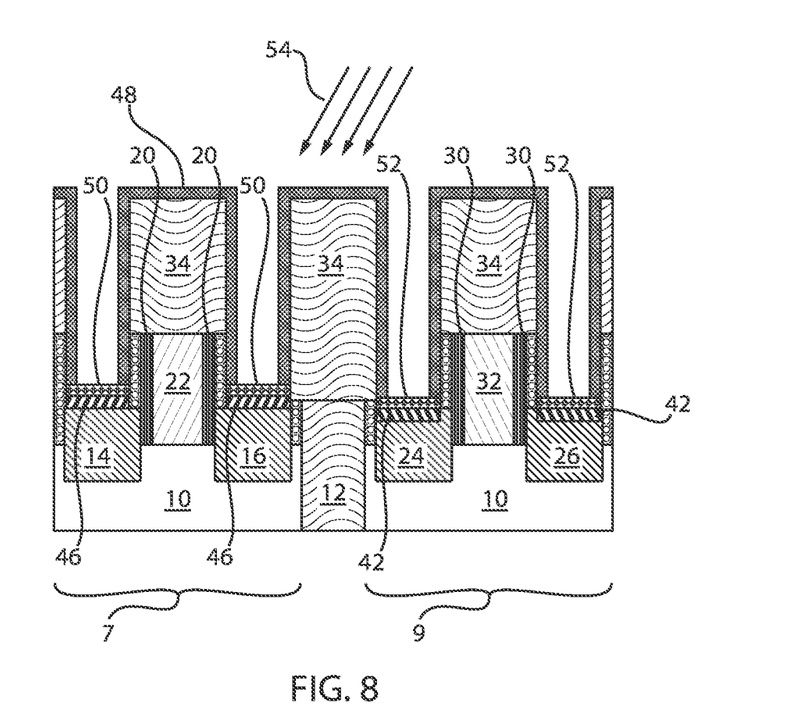
FIG. 8 is a cross-sectional view of the semiconductor structure of FIG. 7 where silicide is formed over the source/drain regions of the nFET and the pFET by thermal anneal, in accordance with an embodiment of the present invention.

FIG. 8 is a cross-sectional view of the semiconductor structure of FIG. 7 where silicide is formed over the source/drain regions of the nFET and the pFET by thermal anneal, in accordance with an embodiment of the present invention.

In various exemplary embodiments, a thermal anneal 54 takes place to form silicide layers 50 over the epitaxial layers 46 of the nFET device 7 and to form silicide layers 52 over the germanium-rich layer 42 of the pFET device 9. Preferably, a thermal anneal includes millisecond or nanosecond laser spike anneal (LSA) to avoid the thermal effects on high-k/metal gate 22, 32, which are already formed previously.

Figure 9:
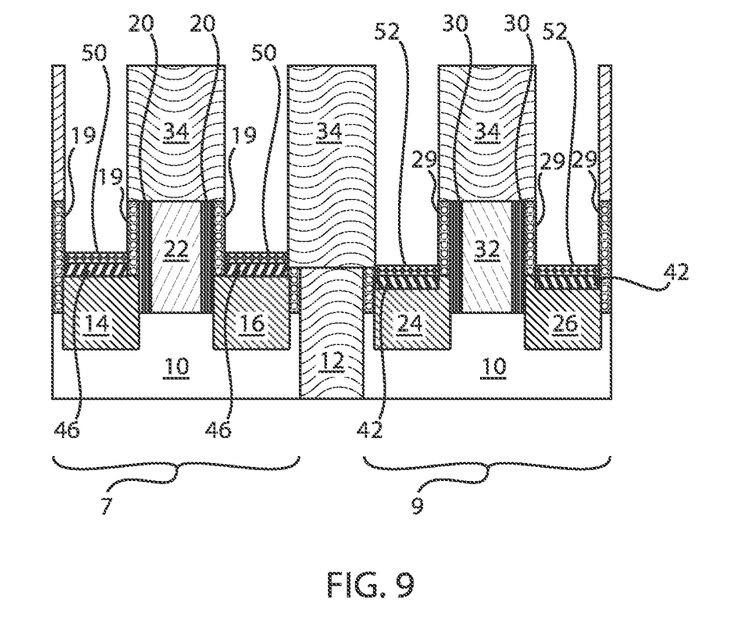
FIG. 9 is a cross-sectional view of the semiconductor structure of FIG. 8 where the barrier layer is removed, in accordance with an embodiment of the present invention.

FIG. 9 is a cross-sectional view of the semiconductor structure of FIG. 8 where the barrier layer is removed, in accordance with an embodiment of the present invention.

In various exemplary embodiments, the remaining barrier layer 48 is removed to expose sidewalls 19 of the dielectric liner 18 of the nFET device 7 and sidewalls 29 of the dielectric liner 28 of the pFET device 9. The silicide layers 50, 52 of the nFET and pFET devices 7, 9, respectively, remain intact. The removal of the barrier layer 48 can be accomplished by, e.g., dry or wet etch.

Figure 10:
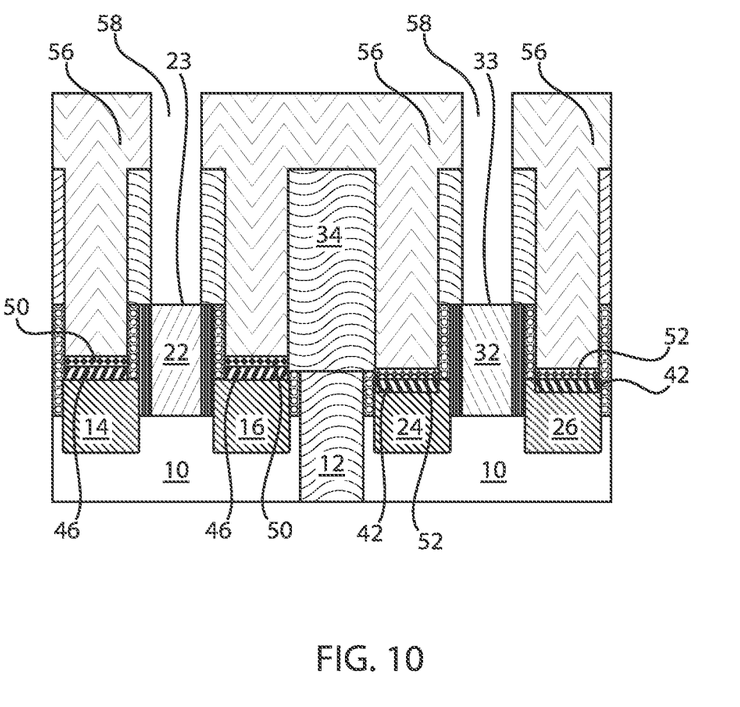
FIG. 10 is a cross-sectional view of the semiconductor structure of FIG. 9 where a hardmask is deposited and recesses are formed to access the gate structures of the nFET and the pFET, in accordance with an embodiment of the present invention.

FIG. 10 is a cross-sectional view of the semiconductor structure of FIG. 9 where a hardmask is deposited and recesses are formed to access the gate structures of the nFET and the pFET, in accordance with an embodiment of the present invention.

In various exemplary embodiments, a hardmask 56 is deposited over the structure. The hardmask 56 is selectively etched, by e.g., RIE, to form openings 58 to expose a top surface 23 of the first gate structure 22 and a top surface 33 of the second gate structure 32.

Figure 11:
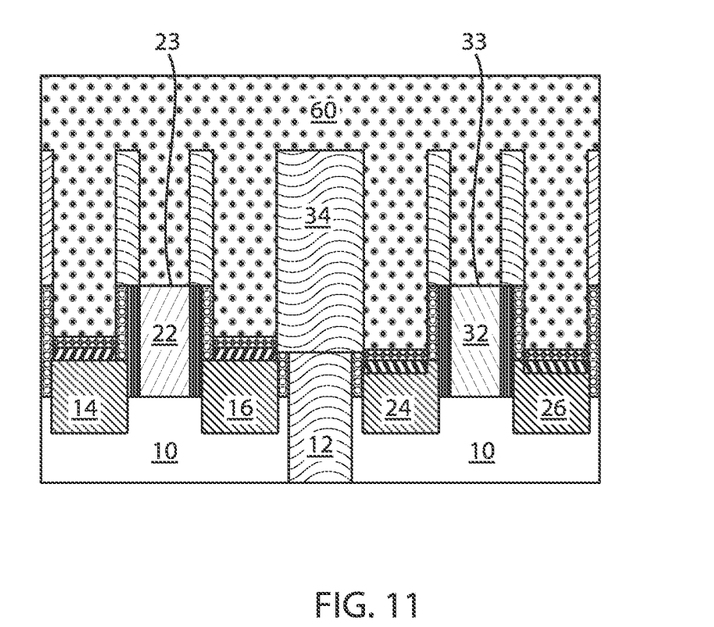
FIG. 11 is a cross-sectional view of the semiconductor structure of FIG. 10 where the recesses are filled with a conductive material, in accordance with an embodiment of the present invention.

FIG. 11 is a cross-sectional view of the semiconductor structure of FIG. 10 where the recesses are filled with a conductive material, in accordance with an embodiment of the present invention.

In various exemplary embodiments, a conductive material 60 is formed within the openings 58 to contact the top surfaces 23, 33 of the first and second gate structures 22, 32, respectively. The conductive material 60 can be referred to as a metal fill. The metal fill 60 can be, e.g., tungsten (W) or cobalt (Co) with silicide metal liner such as titanium (Ti) and/or titanium nitride (TiN).

Figure 12:
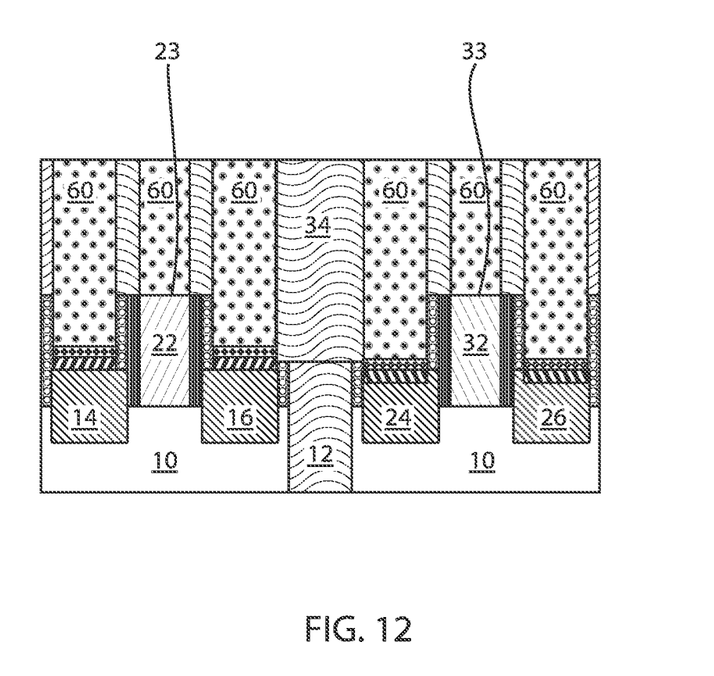
FIG. 12 is a cross-sectional view of the semiconductor structure of FIG. 11 where the conductive material is planarized, in accordance with an embodiment of the present invention.

FIG. 12 is a cross-sectional view of the semiconductor structure of FIG. 11 where the conductive material is planarized, in accordance with an embodiment of the present invention.

In various exemplary embodiments, the top surface of the metal fill 60 can be flush with the top surface of the ILD 34. The metal fill 60 directly contacts the top surface of the silicide layers 50, 52 of the nFET and pFET devices 7, 9, respectively. Additionally, the metal fill 60 directly contacts the top surfaces of the first and second gate structures 22, 32. As a result, a process scheme of maskless Si:P and Ge-rich SiGe:B trench epitaxial growth for advanced transistor fabrication is introduced. By employing a metal semiconductor interface for pFET:TiGex/Ge-rich SiGe:B/SiGe:B and a metal semiconductor interface for the nFET:TiSix/Si:P, a maskless source/drain formation process to reduce S/D contact resistivity can be achieved.

Figure 13:
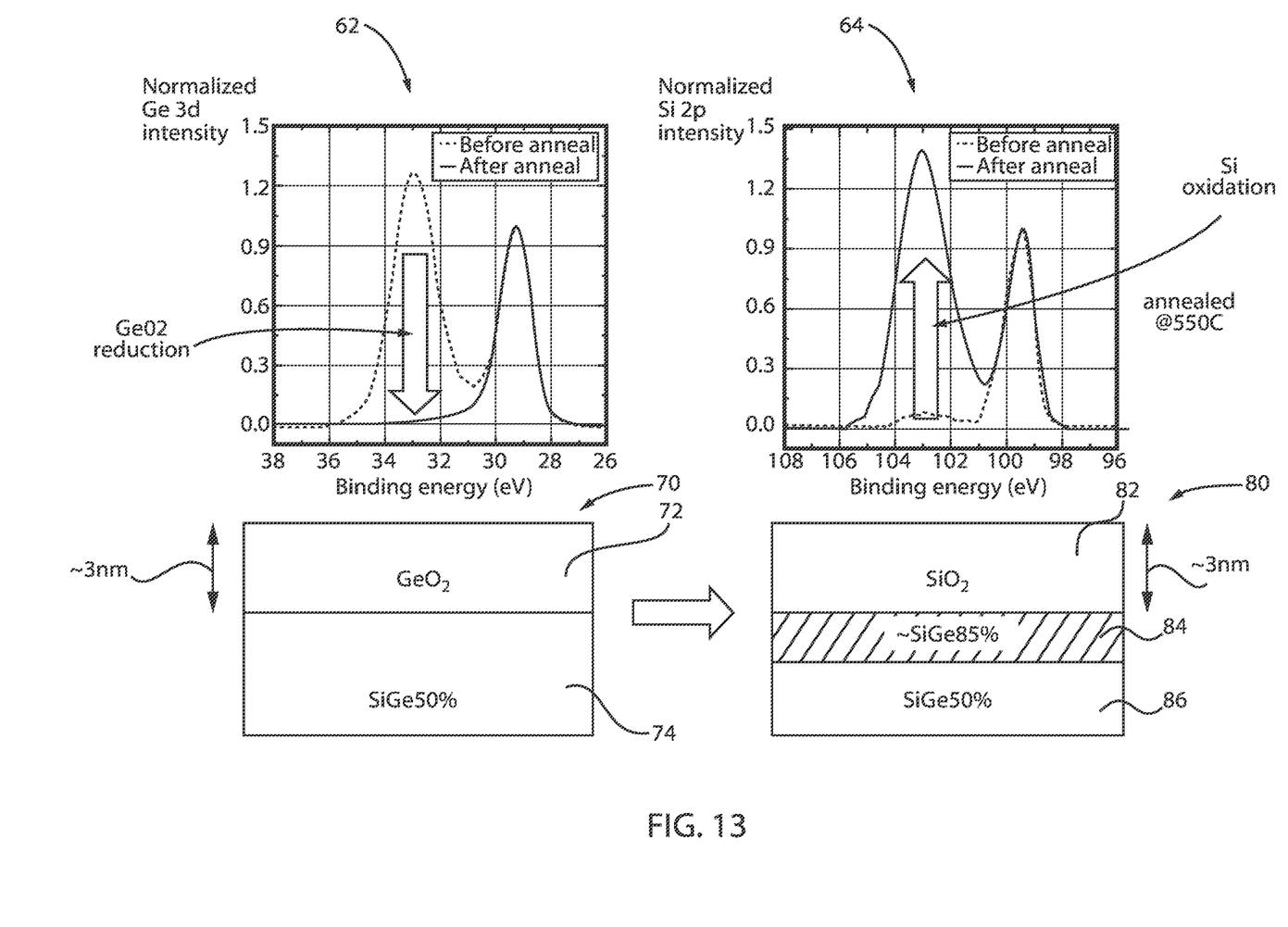
FIG. 13 are diagrams illustrating selective germanium condensation on a silicon germanium surface, in accordance with an embodiment of the present invention.

FIG. 13 are diagrams illustrating selective germanium condensation on a silicon germanium surface, in accordance with an embodiment of the present invention.

The structure 70 includes a $GeO_2$ layer 72 formed over a SiGe layer 74. The SiGe layer 74 can include 50% Ge concentration. The condensation process described in FIG. 4 above results in structure 80 including a SiGe layer 84 sandwiched between a $SiO_2$ layer 82 and a SiGe layer 86 (with 50% Ge concentration). The $GeO_2$ layer 72 has a thickness of about 3 nm and, after condensation, the formed $SiO_2$ layer 82 has a thickness of about 3 nm. Si in the SiGe substrate is selectively oxidized due to the lower Gibbs free energy. Graph 62 illustrates normalized Ge $3d$ intensity, whereas graph 64 illustrates normalized Si $2p$ intensity.

In summary, the present disclosure discloses a method and process scheme for the trench epitaxial growth of both Si:P and Ge-rich SiGe:B at the S/D region without additional masks, which can reduce the contact resistance of both nFET and pFET as well as process complexity. This invention further discloses use of ALD-$GeO_2$ layer in middle-of-line (MOL) module to have a selective Ge condensation at SiGe:B S/D region. The exemplary embodiments of the present invention only modify the SiGe:B surface in the pFET due to the reaction of $GeO_2$ with SiGe surface during the selective Ge condensation process in inert gas ambient. The pFET S/D includes SiGe:B, whereas the nFET S/D includes Si:P to achieve the process scheme of maskless Si:P and Ge-rich SiGe:B trench epitaxial growth. Therefore, a maskless process scheme for the trench epitaxial source/drain formation is one of the key aspects of this disclosure. Conventional trench epitaxial source/drain formation requires at least two masks to have two different source/drain epitaxial layers on nFET and pFET. However, the exemplary embodiments of the present disclosure do not require the mask for the patterning, which can significantly reduce the process complexity.

It will be helpful in appreciating the effects of the invention in the following discussion to recall that selectivity of etching is generally a function of a difference in etch rates of different materials for a given etchant chemistry. Therefore, factors that tend to slow the etching of the selectively etched material tends to reduce effective selectivity to other materials and that best selectivity will be observed when the etch progresses as rapidly as possible.

Regarding FIGS. 1-12, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks employed to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be employed in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing maskless epitaxial growth of Si:P and SiGe:B for advanced source/drain contact (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure having reduced parasitic contact resistance, the semiconductor structure comprising:
    a first device disposed over a semiconductor structure;
    a second device disposed adjacent the first device, the first and second devices separated from each other by a sidewall trench isolation (STI) structure;
    first source/drain regions of the first device;
    second source/drain regions of the second device;
    a germanium-rich epitaxial growth layer directly contacting a top surface of the second source/drain regions of the second device;
    an epitaxial layer directly contacting a top surface of the first source/drain regions of the first device;
    silicide layers directly contacting top surfaces of the epitaxial layer of the first device and the germanium-rich epitaxial growth layer of the second device; and
    a conductive material disposed in direct contact with the silicide layers,
    wherein the silicide layers directly contacting the top surfaces of the epitaxial layer of the first device are horizontally misaligned with respect to the silicide layers directly contacting the top surfaces of germanium-rich epitaxial growth layer of the second device.

2. The semiconductor structure of claim 1, wherein the first device is an n-type field-effect-transistor (nFET) and the second device is a p-type field-effect-transistor (pFET).

3. The semiconductor structure of claim 2, wherein the source/drain regions of the nFET are phosphorous-doped silicon regions.

4. The semiconductor structure of claim 3, wherein the source/drain regions of the pFET are boron-doped silicon germanium regions.

5. The semiconductor structure of claim 1, wherein an ILD is disposed over the STI structure.

6. The semiconductor structure of claim 1, wherein the first device includes a first gate conductor and the second device includes a second gate conductor.

7. The semiconductor structure of claim 6, wherein first spacers are formed adjacent the first gate conductor and second spacers are formed adjacent the second gate conductor.

8. The semiconductor structure of claim 7, wherein the first spacers and the second spacers directly contact a dielectric liner.

9. A semiconductor structure having reduced parasitic contact resistance, the semiconductor structure comprising:
 an nFET device and a pFET device disposed over a semiconductor structure;
 phosphorous-doped silicon (Si:P) source/drain regions disposed in the nFET device;
 boron-doped silicon-germanium (SiGe:B) source/drain regions disposed in the pFET device;
 epitaxial layers disposed in direct contact with the Si:P source/drain regions;
 Ge-rich epitaxial growth layers disposed in direct contact with the SiGe:B source/drain regions; and
 silicide layers directly contacting top surfaces of the epitaxial layers of the nFET device and the Ge-rich epitaxial growth layers of the pFET device,
 wherein the silicide layers directly contacting the top surfaces of the epitaxial layers of the nFET device are horizontally misaligned with respect to the silicide layers directly contacting the top surfaces of Ge-rich epitaxial growth layers of the pFET device.

10. The semiconductor structure of claim 9, wherein the silicide layers are formed by a thermal anneal process.

11. The semiconductor structure of claim 9, wherein the nFET device includes a first gate conductor and the pFET device includes a second gate conductor.

12. The semiconductor structure of claim 11, wherein first spacers are formed adjacent the first gate conductor and second spacers are formed adjacent the second gate conductor.

13. The semiconductor structure of claim 12, wherein the first spacers and the second spacers directly contact dielectric liners.

14. The semiconductor structure of claim 13, wherein the dielectric liners directly contact sidewalls of the epitaxial layers of the nFET device and the Ge-rich epitaxial growth layers of the pFET device.

15. The semiconductor structure of claim 14, wherein the dielectric liners are perpendicular to the epitaxial layers of the nFET device.

16. The semiconductor structure of claim 14, wherein the dielectric liners are perpendicular to the Ge-rich epitaxial growth layers of the pFET device.

17. The semiconductor structure of claim 9, wherein the nFET device is separated from the pFET device by a shallow trench isolation (STI) structure.

18. The semiconductor structure of claim 17, wherein an interlayer dielectric (ILD) is disposed over and in direct contact with the STI structure.

* * * * *